US006988016B2

(12) United States Patent
Mimotogi

(10) Patent No.: US 6,988,016 B2
(45) Date of Patent: Jan. 17, 2006

(54) METHOD FOR EVALUATING LITHOGRAPHY PROCESS MARGINS

(75) Inventor: Shoji Mimotogi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 10/673,236

(22) Filed: Sep. 30, 2003

(65) Prior Publication Data

US 2004/0123267 A1    Jun. 24, 2004

(30) Foreign Application Priority Data

Oct. 1, 2002    (JP)    ............................ P2002-289210

(51) Int. Cl.
*G06F 19/00*    (2006.01)
(52) U.S. Cl. ............................ 700/121; 716/4; 716/21
(58) Field of Classification Search ................ 700/121; 355/53; 430/5, 311, 312; 716/4, 19, 21; 438/14
See application file for complete search history.

(56) References Cited

U.S. PATENT DOCUMENTS

| 5,303,002 | A | * | 4/1994 | Yan | ............................ | 355/53 |
| 6,004,701 | A | * | 12/1999 | Uno et al. | ...................... | 430/5 |
| 6,100,515 | A | * | 8/2000 | Nishi et al. | .................. | 250/205 |
| 6,610,460 | B2 | * | 8/2003 | Komatsu et al. | ............ | 430/312 |
| 6,760,892 | B2 | * | 7/2004 | Taoka et al. | .................... | 716/4 |
| 2002/0188925 | A1 | * | 12/2002 | Higashi | ........................ | 716/21 |

FOREIGN PATENT DOCUMENTS

| JP | 2-224319 | 9/1990 |
| JP | 10-199787 | 7/1998 |

OTHER PUBLICATIONS

Wong et al—"The Mask Error Factor in Optical Lithography"—IEEE Transactions on Semiconductor Manufacturing, May 2000, vol. 13 Issue 2.*
Miwa et al—"A new method for calculating one-dimensional process margin in consideration of process variations"—4th International Workshop on Statistical Metrology, Jun. 12, 1999.*

* cited by examiner

*Primary Examiner*—Leo Picard
*Assistant Examiner*—Alexander Kosowski
(74) *Attorney, Agent, or Firm*—Finnegan, Henderson, Farabow, Garrett & Dunner, L.L.P.

(57) ABSTRACT

Setting values of a light exposure and a focus position are set in an exposure process for forming a pattern on a substrate. Pseudo measured dimensions of the pattern are calculated with respect to each of the combinations of the setting values. ED-trees and a plurality of margin curves are calculated based on the pseudo measured dimensions with respect to each of the combinations. A dispersion of a tolerance of the light exposure of the margin curves is calculated at a depth of focus corresponding to a maximum difference in height of the substrate.

14 Claims, 11 Drawing Sheets

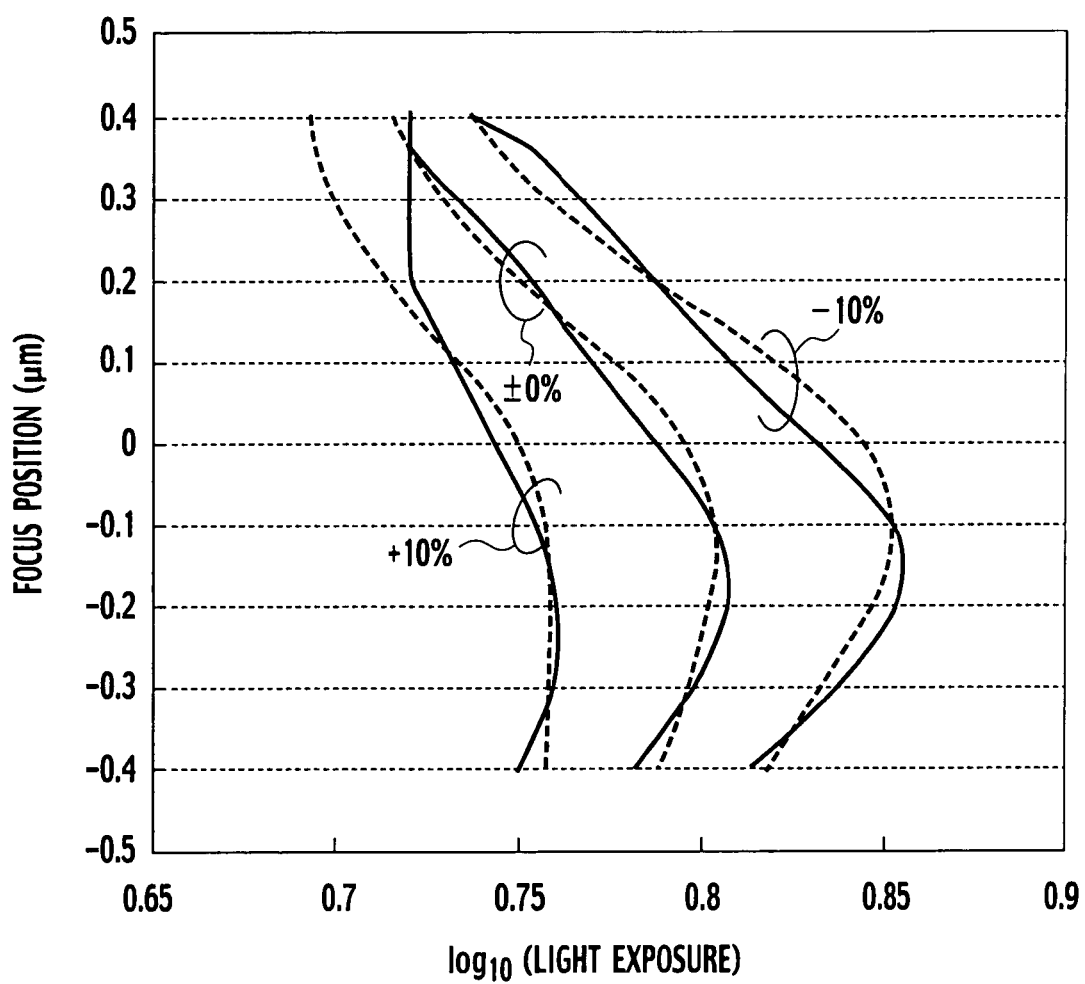

METHOD FOR EVALUATING LITHOGRAPHY PROCESS MARGINS

CROSS REFERENCE TO RELATED APPLICATIONS

This application is based upon and claims the benefit of priority from prior Japanese Patent Applications No. P2002-289210, filed on Oct. 1, 2002; the entire contents of which are incorporated herein by reference.

BACKGROUND OF THE INVENTION

1. Field of the Invention

The present invention relates to lithographic technology of a method for fabricating a semiconductor device. In particular, the present invention relates to a method for evaluating a process margin of lithography.

2. Description of the Related Art

In order to evaluate a process margin of a lithographic process, it is necessary to obtain a highly accurate measurement of the dimensional dependency of a resist pattern on a light exposure and a focus position. With increasing fineness of a circuit pattern of a semiconductor device and increasing fineness of a resist pattern, the edge roughness of a resist and an error by a dimension measuring device are no longer negligible. If the dimension of the resist pattern cannot be measured with high accuracy, that is, if there are variations in dimension of the resist pattern, a process margin may not be accurately evaluated.

A light exposure and focus position have been assigned irrespective of the dimensional variations of the resist, followed by exposure. Thereafter, dimensions of the resist have been measured, and then, the process margin has been calculated. There have been few means for evaluating the reproducibility or error of the calculated process margin. Therefore, there has been an apprehension of overestimating or underestimating the process margin.

SUMMARY OF THE INVENTION

An aspect of the present invention inheres in a computer-implemented method for evaluating a process margin according to embodiments of the present invention including setting a plurality of setting values of a light exposure and a plurality of setting values of a focus position in an exposure process for forming a pattern on a substrate to be exposed to light, calculating a plurality of pseudo measured dimensions of the pattern with respect to each of the combinations of the setting values of the light exposure and the setting values of the focus position, calculating a plurality of ED-trees and calculating a plurality of margin curves based on the pseudo measured dimensions with respect to each of the combinations, and calculating a dispersion of a tolerance of the light exposure of the margin curves at a depth of focus corresponding to a maximum difference in height of the substrate.

Another aspect of the present invention inheres in a computer-implemented method for setting up a measurement condition of a process margin according to embodiments of the present invention including setting a plurality of setting values of a light exposure at equal first intervals and setting a plurality of setting values of a focus position at equal second intervals in an exposure process for forming a pattern on a substrate to be exposed to light, calculating a plurality of pseudo measured dimensions of the pattern with respect to each of the combinations of the setting values of the light exposure and the setting values of the focus position, calculating a plurality of ED-trees and calculating a plurality of margin curves based on the pseudo measured dimensions with respect to each of the combinations, calculating a dispersion of a tolerance of the light exposure of the margin curves at a depth of focus corresponding to a maximum difference in height of the substrate, and reducing the first interval or the second interval so as to reduce the dispersion of the tolerance of the light exposure while increasing the first interval or the second interval so as to increase the dispersion of the tolerance of the light exposure.

Still another aspect of the present invention inheres in a computer program product to be executed by a computer for evaluating a process margin according to embodiments of the present invention including instructions configured to set a plurality of setting values of a light exposure and a plurality of setting values of a focus position in an exposure process for forming a pattern on a substrate to be exposed to light, instructions configured to calculate a plurality of pseudo measured dimensions of the pattern with respect to each of the combinations of the setting values of the light exposure and the setting values of the focus position, instructions configured to calculate a plurality of ED-trees and configured to calculate a plurality of margin curves based on the pseudo measured dimensions with respect to each of the combinations, and instructions configured to calculate the dispersion of the tolerance of the light exposure of the margin curves at a depth of focus corresponding to a maximum difference in height of the substrate.

Still another aspect of the present invention inheres in a computer program product to be executed by a computer for setting up a measurement condition of a process margin according to embodiments of the present invention including instructions configured to set a plurality of setting values of a light exposure at equal first intervals and setting a plurality of setting values of a focus position at equal second intervals in an exposure process for forming a pattern on a substrate to be exposed to light, instructions configured to calculate a plurality of pseudo measured dimensions of the pattern with respect to each of the combinations of the setting values of the light exposure and the setting values of the focus position, instructions configured to calculate a plurality of ED-trees and calculating a plurality of margin curves based on the pseudo measured dimensions with respect to each of the combinations, instructions configured to calculate a dispersion of a tolerance of the light exposure of the margin curves at a depth of focus corresponding to a maximum difference in height of the substrate, and instructions configured to reduce the first interval or the second interval so as to reduce the dispersion of the tolerance of the light exposure while configured to increase the first interval or the second interval so as to increase the dispersion of the tolerance of the light exposure.

BRIEF DESCRIPTION OF THE DRAWINGS

FIGS. 4A and 4B are graphs illustrating the step of adding random numbers generated in the dimension of a resist calculated in the method for evaluating the process margin in the first embodiment according to the present invention, wherein FIG. 4A is a graph illustrating the dependency of the dimension of the resist on a light exposure and a focus position before the random numbers are added and FIG. 4B is a graph illustrating the dependency of the dimension of the resist on the light exposure and the focus position after the random numbers are added;

FIG. 5 is a graph illustrating an ED-tree in the method for evaluating the process margin in the first embodiment according to the present invention;

DETAILED DESCRIPTION OF THE INVENTION

Figure 1:
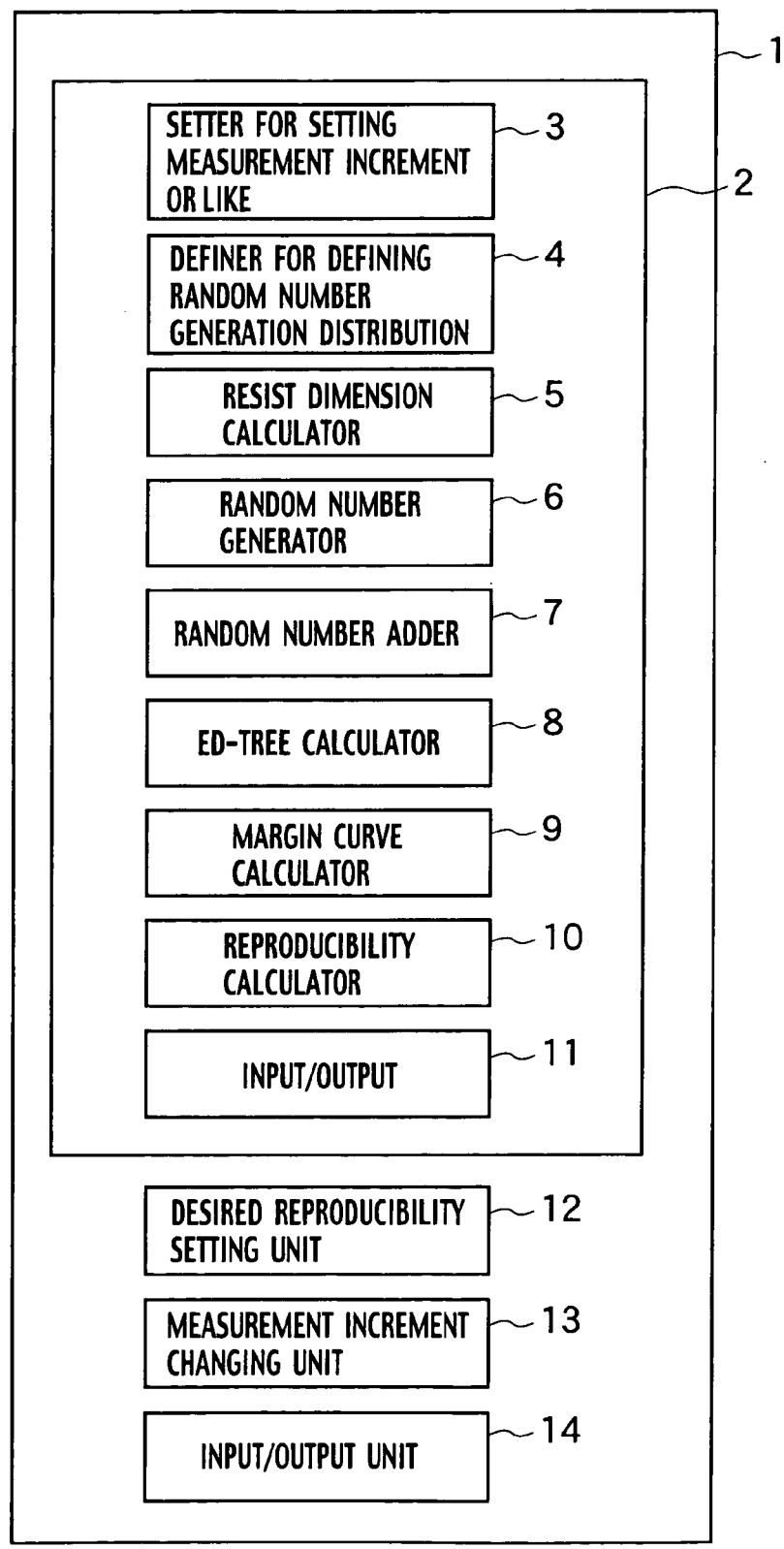
FIG. 1 is a diagram illustrating the configuration of an apparatus for setting up a measurement condition in consideration of a process margin in a first embodiment according to the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

An apparatus 1 for setting up a measurement condition capable of evaluating and measuring a process having a process margin in a first embodiment according to the present invention encompasses an apparatus 2 for evaluating a process margin, a desired reproducibility setting unit 12, a measurement increment changing unit 13 and an input/output unit 14, as illustrated in FIG. 1.

The apparatus 2 for evaluating a process margin in the first embodiment according to the present invention embraces a setter 3 for setting a measurement increment or the like, a definer 4 for defining a random number generation distribution, a resist dimension calculator 5, a random number generator 6, a random number adder 7, an ED-tree calculator 8, a margin curve calculator 9, a reproducibility calculator 10 and an input/output 11.

The setter 3 for setting a measurement increment or the like sets a plurality of setting values of a light exposure by increments at equal first intervals in an exposure process for forming a circuit pattern on a semiconductor substrate with a resist in a semiconductor device. Further, the setter 3 sets a plurality of setting values of a focus position by increments at equal second intervals.

The definer 4 for defining a random number generation distribution defines random numbers which are generated in the distribution in the same level of dispersion when the measured dimension of a resist pattern is varied and dispersed.

The resist dimension calculator 5 calculates the calculated dimension of the resist pattern by receiving the setting values of the light exposure and the setting values of the focus position.

The random number generator 6 generates the random numbers defined by the definer 4 for defining the random number generation distribution.

The random number adder 7 adds the random numbers to the calculated dimension, so as to generate a pseudo measured dimension.

The ED-tree calculator 8 calculates an ED-tree based on the setting values of the light exposure, the setting values of the focus position and the pseudo measured dimension. The ED-tree is provided on an x-y plane, on which the x axis represents the natural logarithm of the light exposure while the y axis represents the focus position. The ED-tree has an upper limit curve, on which the pseudo measured dimension accords with an upper limit of an allowable dimension of a pattern, on the plane consisting of the natural logarithm of the light exposure and the focus position. Furthermore, the ED-tree has a lower limit curve, on which the pseudo measured dimension accords with a lower limit of the allowable dimension of the resist pattern, on the plane consisting of the natural logarithm of the light exposure and the focus position. The ED-tree may have a target curve, on which the pseudo measured dimension accords with a target dimension of the resist pattern, on the x-y plane consisting of the natural logarithm of the light exposure and the focus position.

The margin curve calculator 9 calculates a margin curve based on the ED-tree. A rectangle is defined between the upper limit curve and the lower limit curve of the ED-tree, which inscribes the upper limit curve and the lower limit curve, and has an exposure side parallel to the x axis representing the natural logarithm of the light exposure and a focus side parallel to the y axis representing the focus position. The length of the exposure side expresses the tolerance of the light exposure. In contrast, the length of the focus side expresses the depth of focus. The margin curve is drawn on the x-y plane, in which the x axis represents the tolerance of the light exposure while the y axis represents the depth of focus. The margin curve is a curve based on the exposure side and the focus side, which constitutes the rectangle, on the x-y plane.

The reproducibility calculator 10 calculates the dispersion of the tolerance of the light exposure of each of the plurality of margin curves at the depth of focus corresponding to a maximum difference in height of the semiconductor substrate. When the dispersion of the tolerance of the light exposure is large, the variation of the tolerance of the light exposure is large. As a result, it is determined that the reproducibility of the tolerance of the light exposure is low.

The input/output 11 receives the setting value of the light exposure, the setting value of the focus position and the dispersion of the random numbers, and outputs the dispersion of the tolerance of the light exposure.

The desired reproducibility setting unit 12 sets the dispersion of the tolerance of the light exposure, in which the process having the process margin can be evaluated and measured.

The measurement increment changing unit 13 changes the first intervals of the plurality of setting values of the light exposure and the second intervals of the plurality of setting values of the focus position.

The input/output unit 14 receives the desired dispersion of the tolerance of the light exposure, and outputs the optimized first and second intervals.

The apparatus 1 for setting up the measurement condition can be implemented by a computer for executing a program for setting up the measurement condition. Moreover, the apparatus 2 for evaluating the process margin can be implemented by a computer for executing a program for evaluating the process margin.

(Method for Evaluating Process Margin)

Figure 2:
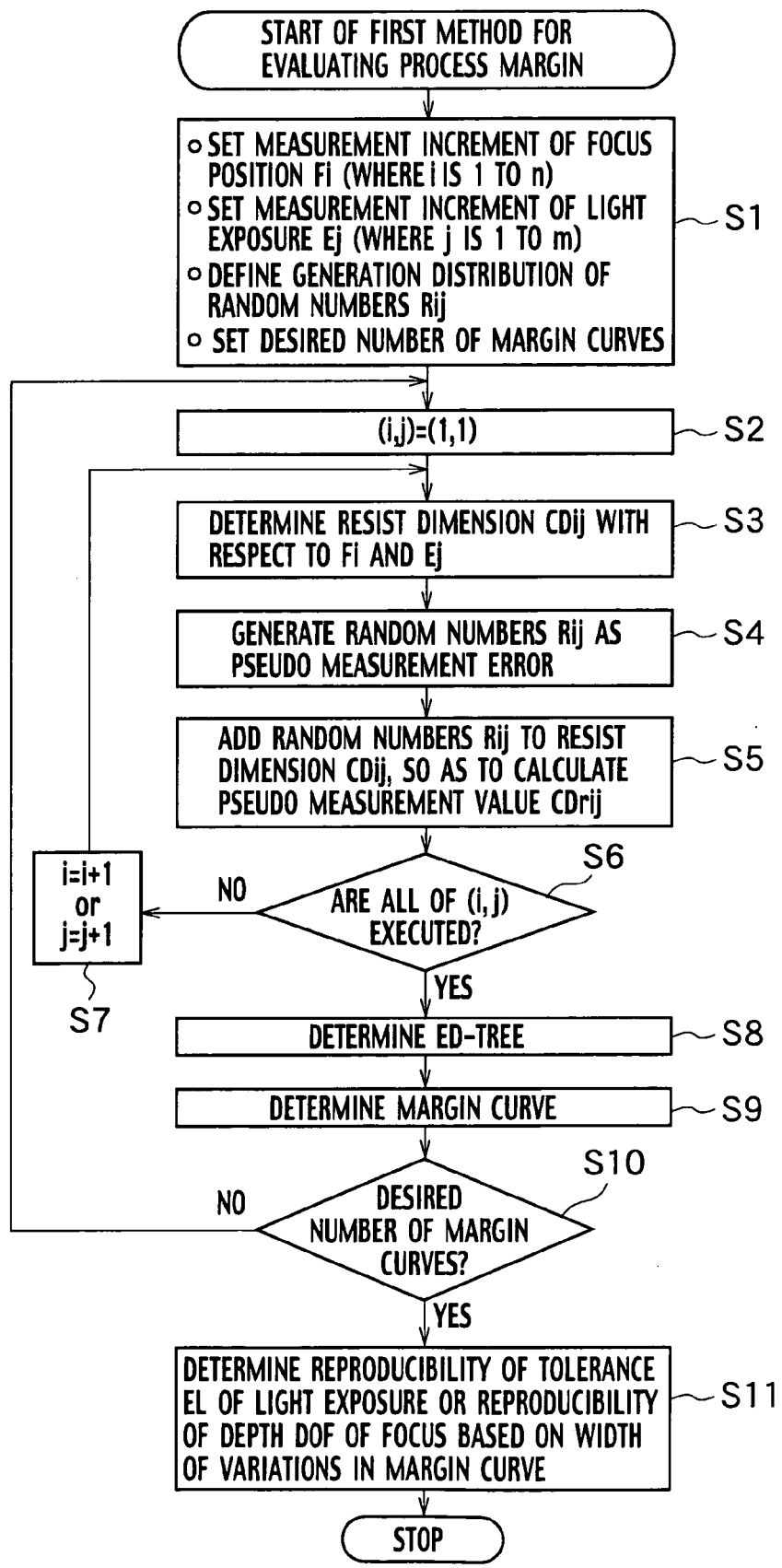
FIG. 2 is a flowchart illustrating a method for evaluating the process margin in the first embodiment according to the present invention.

A first method for evaluating a process margin in the first embodiment according to the present invention is carried out by the apparatus 2 for evaluating the process margin illustrated in FIG. 1. In the first method for evaluating a process margin, first, the setter 3 for setting the measurement increment sets a plurality of setting values Ej (where j is 1 to n) of the light exposure and a plurality of setting values Fi (where i is 1 to m) of the focus position in an exposure process for forming the pattern on the substrate to be exposed to light in step S1, as illustrated in FIG. 2. Furthermore, the setter 3 for setting the measurement increment sets a plurality of desired margin curves. Moreover, in step S1, the definer 4 for defining the random number generation distribution sets the dispersion of the generation distribution of dimensional random numbers Rij in such a manner as to be equal to the dispersion of the distribution of the measured dimension of the pattern. Each of numbers i and j is set to an initial value 1 in step S2.

In step S3, the resist dimension calculator 5 calculates a pattern calculated dimension CD11 with respect to a combination (1, 1) of the setting value E1 of the light exposure and the setting value F1 of the focus position. The calculated dimension CD11 gives a so-called pseudo real value of the pattern dimension. Here, an actual measurement value may be used in place of the calculated dimension CD11.

In step S4, the random number generator 6 generates a dimensional random number R11 with respect to the combination (1, 1). The dimensional random number R11 gives a pseudo measurement error of a pattern dimension with respect to the pseudo real value.

In step S5, the random number adder 7 calculates a pseudo measured dimension CDr11 by adding the dimensional random number R11 to the calculated dimension CD11 with respect to the combination (1, 1).

In step S6, it is determined whether or not the pseudo measured dimensions CDrij are calculated with respect to all of the combinations (i, j). Unless the pseudo measured dimensions CDrij are calculated with respect to all of the combinations (i, j), the control routine proceeds to step S7. In step S7, the number i or j is added to 1, and then, the control routine returns to step S3. In contrast, if the pseudo measured dimensions CDrij are calculated with respect to all of the combinations (i, j), the control routine proceeds to step S8. In step S8, the ED-tree calculator 8 calculates a set of ED-trees based on the setting values Fi of the focus position, the setting values Ej of the light exposure and the pseudo measured dimensions CDrij with respect to all of the combinations (i, j).

In step S9, the margin curve calculator 9 calculates one margin curve based on one set of ED-trees.

In step S10, it is determined whether or not the number of margin curves corresponds to a desired value. Unless the number of margin curves corresponds to the desired value, the control routine returns to step S2. In contrast, if the number of margin curves corresponds to the desired value, the control routine proceeds to step S11.

In step S11, the reproducibility calculator 10 calculates the dispersion based on the distribution of the tolerance of the light exposure of the desired number of margin curves at a depth of focus DOF corresponding to the maximum difference in height of the substrate to be exposed to the light. Otherwise, the reproducibility calculator 10 calculates the dispersion based on the distribution of the depth of focus DOF of the desired number of margin curves in the tolerance of the light exposure corresponding to a maximum fluctuation of the light exposure of an exposure device. The smaller the dispersion, the higher the reproducibility.

All of the steps in the method for evaluating the process margin are stored in an internal memory or an external memory in a computer as procedures which can be executed by the computer. The program for evaluating the process margin includes such procedures. In the method for evaluating the process margin in the first embodiment, an error of the process margin can be evaluated.

(Method for Setting Up Measurement Condition)

Figure 3:
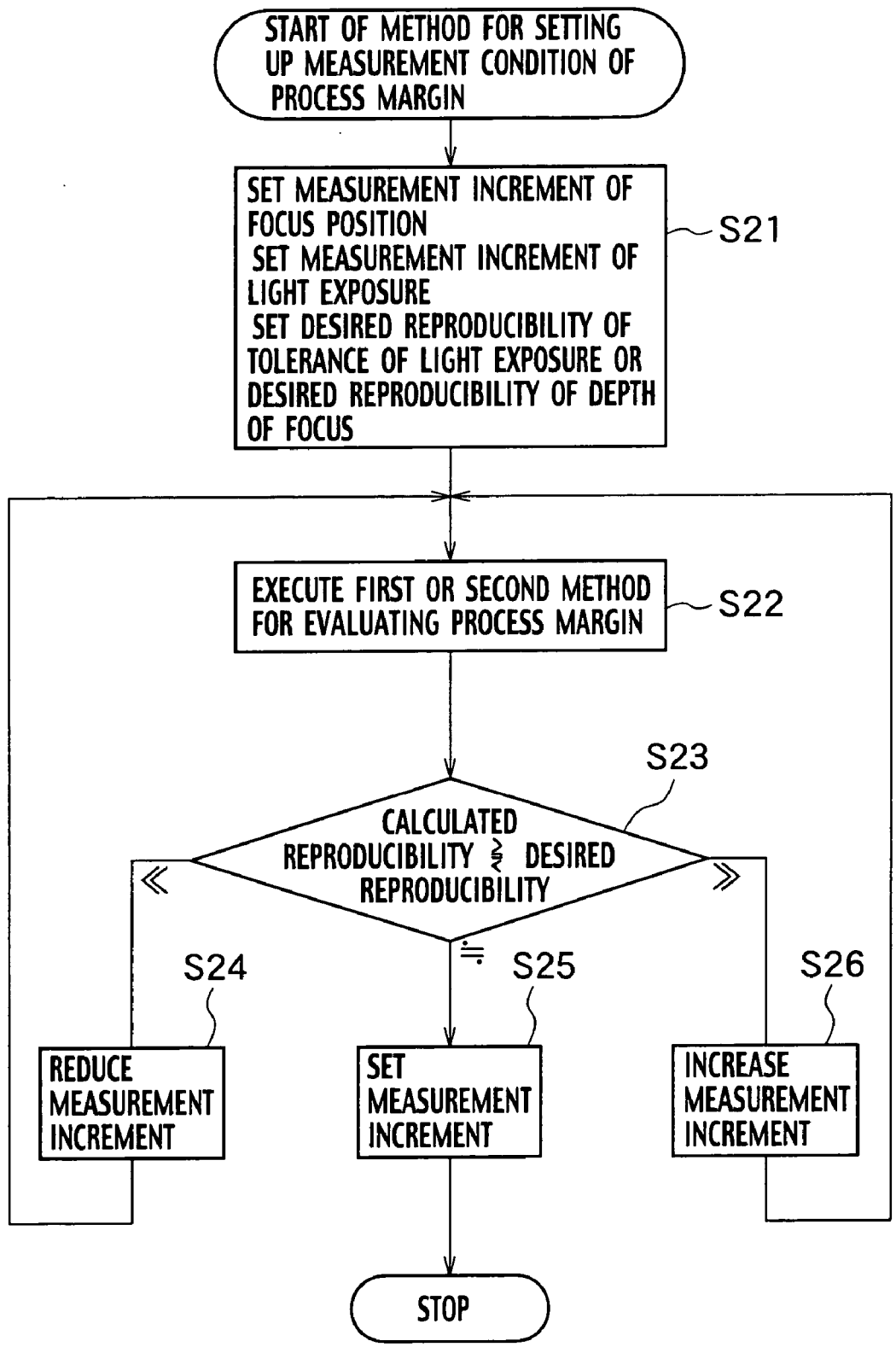
FIG. 3 is a flowchart illustrating a method for setting up the measurement condition in consideration of the process margin in the first embodiment according to the present invention.

A method for setting up a measurement condition in the first embodiment according to the present invention is carried out by the apparatus 1 for setting up the measurement condition. As illustrated in FIG. 3, in the method for setting up the measurement condition, the desired reproducibility setting unit 12 first sets the plurality of setting values Ej (j is 1 to n) of the light exposure and the plurality of setting values Fi (i is 1 to m) of the focus position in the exposure process for forming the pattern on the substrate to be exposed to the light in step 21. Furthermore, the desired reproducibility setting unit 12 sets the desired reproducibility of the tolerance of the light exposure or the desired reproducibility of the depth of focus. Specifically, the desired reproducibility setting unit 12 sets the dispersion of the distribution of the tolerance of the light exposure of the desired number of margin curves at the depth of focus DOF corresponding to the maximum difference in height of the substrate to be exposed to the light. Otherwise, the desired reproducibility setting unit 12 sets the dispersion of the distribution of the depth of focus DOF of the desired number of margin curves in the tolerance of the light exposure corresponding to the maximum fluctuation of the light exposure of the exposure device.

Next, in step S22, the apparatus 2 for evaluating the process margin performs the first method for evaluating the process margin. The apparatus 2 for evaluating the process margin calculates the reproducibility of the tolerance of the light exposure or the reproducibility of the depth of focus.

In step S23, the relationship of the magnitude between the calculated reproducibility and the desired reproducibility is determined. Specifically, the relationship of the magnitude between the calculated dispersion and the desired dispersion is determined. In the case where the calculated reproducibility is less than the desired reproducibility (that is, the calculated dispersion is greater than the desired dispersion), the control routine proceeds to step S24, and the measurement increment is reduced. In contrast, in the case where the calculated reproducibility is greater than the desired reproducibility (that is, the calculated dispersion is less than the desired dispersion), the control routine proceeds to step S26, and the measurement increment is increased. Furthermore, in the case where the calculated reproducibility is equal to the desired reproducibility (that is, the calculated dispersion is equal to the desired dispersion), the control routine proceeds to step S25, and the measurement increment for use in the calculation is output. The output measurement increment is used as the measurement increment at the time of actual measurement, thereby determining a sampling plan with the light exposure and the focus position which are assigned in such a manner as to set the error of the evaluated process margin to an allowable value or less. The number of samples in the sampling plan can be minimized by setting the error of the process margin to the allowable value or less.

Here, in order to clarify the relationship of magnitude of the measurement increment, it is desirable that the plurality of setting values $E_j$ of the light exposure or the logarithm of the light exposure should be set at constant intervals, and that the plurality of setting values $F_i$ of the focus position should be set at given intervals.

All of the steps in the method for setting up the measurement condition are stored in the internal memory or the external memory in the computer as procedures which can be executed by the computer. The program for setting up the measurement condition includes such procedures.

(Example of First Embodiment: Evaluation of Process Margin)

Figure 4A:
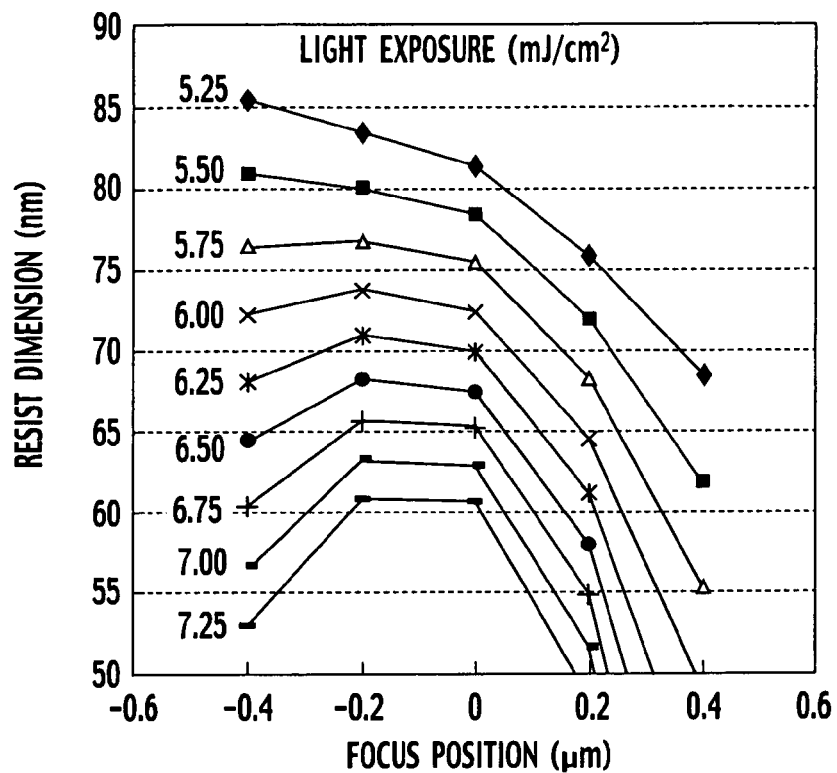

The first method for evaluating the process margin in the first embodiment according to the present invention first sets, in step S1 in FIG. 2, a plurality of setting values of the light exposure from 5.25 mJ/cm² to 7.25 mJ/cm² at an interval of 0.25 mJ/cm² and a plurality of setting values of the focus position from −0.4 μm to 0.4 μm at an interval of 0.2 μm, as illustrated in FIG. 4A. The increment interval of the measurement values of the light exposure is 4% in reference to a proper light exposure. Furthermore, the desired number of margin curves is set to ten. Moreover, the dispersion σ (which is set to 2 nm) of the generation distribution of the dimensional random numbers $R_{ij}$ and an average value of 0 are set. Here, the dispersion σ is assumed to be a dispersion which can vary an apparent resist dimension such as the edge roughness of the resist or the reproducibility in the dimensional measurement. As the distribution function of the generation distribution of the dimensional random numbers $R_{ij}$ can be used as a distribution function of an arbitrary shape. For example, a binominal distribution function, a step function, a triangular distribution function, a trapezoidal distribution function and the like can be used. The numbers i and j are assigned to the setting values in increasing order. In step S2, each of the numbers i and j are set to the initial value 1.

In step S3, 86 nm is calculated as the resist dimension CD11 of the pattern with respect to the combination (1, 1) in which the setting value of the light exposure is 5.25 mJ/cm² and the setting value of the focus position is −0.4 μm. Under calculated exposure conditions, an exposure wavelength λ is 193 nm, the number of apertures NA is 0.6 and an illumination coherence a is 0.3. A Levenson type phase shift mask is used. The dimension of the mask is 70 nm, and the target of the resist is 70 nm. In step S4, as a dimensional random number R11 of 2 nm is generated with respect to the combination (1, 1).

Figure 4B:
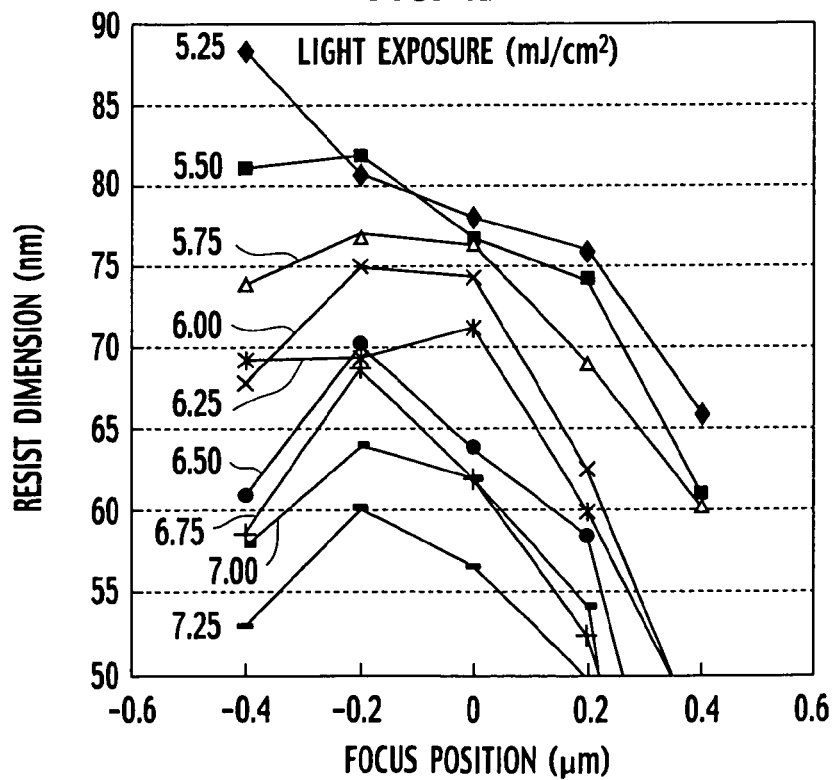

In step S5, as the dimensional random number R11 of 2 nm is added to 86 nm of the resist dimension CD11 with respect to the combination (1, 1). As illustrated in FIG. 4B, 88 nm of the pseudo measurement value CDr11 is obtained as a sum.

In step S6, it is determined whether or not the pseudo measurement values CDrij are calculated with respect to all of the combinations (i, j). Since the pseudo measurement values CDrij are not calculated with respect to all of the combinations (i, j), the control routine proceeds to step S7. In step S7, 1 is added to the number i, and the control routine returns to step S3.

In the same manner, FIG. 4A illustrates the resist dimension CDij in the case where the pseudo measurement values CDrij are calculated with respect to all of the combinations (i, j). FIG. 4B illustrates the pseudo measurement values CDrij.

In step S8, the ED-tree calculator 8 calculates one set of ED-trees by the use of the setting values $F_i$ of the focus position, the setting values $E_j$ of the light exposure and the pseudo measurement values CDrij of all of the combinations (i, j). The pseudo measurement values CDrij are smoothed by a regression analysis.

The light exposure is calculated by the smoothing operation such that the pseudo measured dimensions CDr at the setting values of the focus position become 90%, 100% and 110% with respect to the resist target dimension, respectively, as illustrated in FIG. 5. In this manner, the ED-trees indicated by solid lines, as illustrated in FIG. 5, can be obtained. Here, the ED-trees indicated by dotted lines are adapted for the calculated resist dimensions CD that are not added with the dimensional random numbers R. FIG. 5 illustrates that the curves of the ED-trees indicated by the solid and dotted lines do not completely overlap each other. The tolerance of the resist dimension is set to ±7 nm, and therefore, a ratio of a difference of the resist dimension from the target dimension to the target dimension is set to ±10%.

Figure 6:
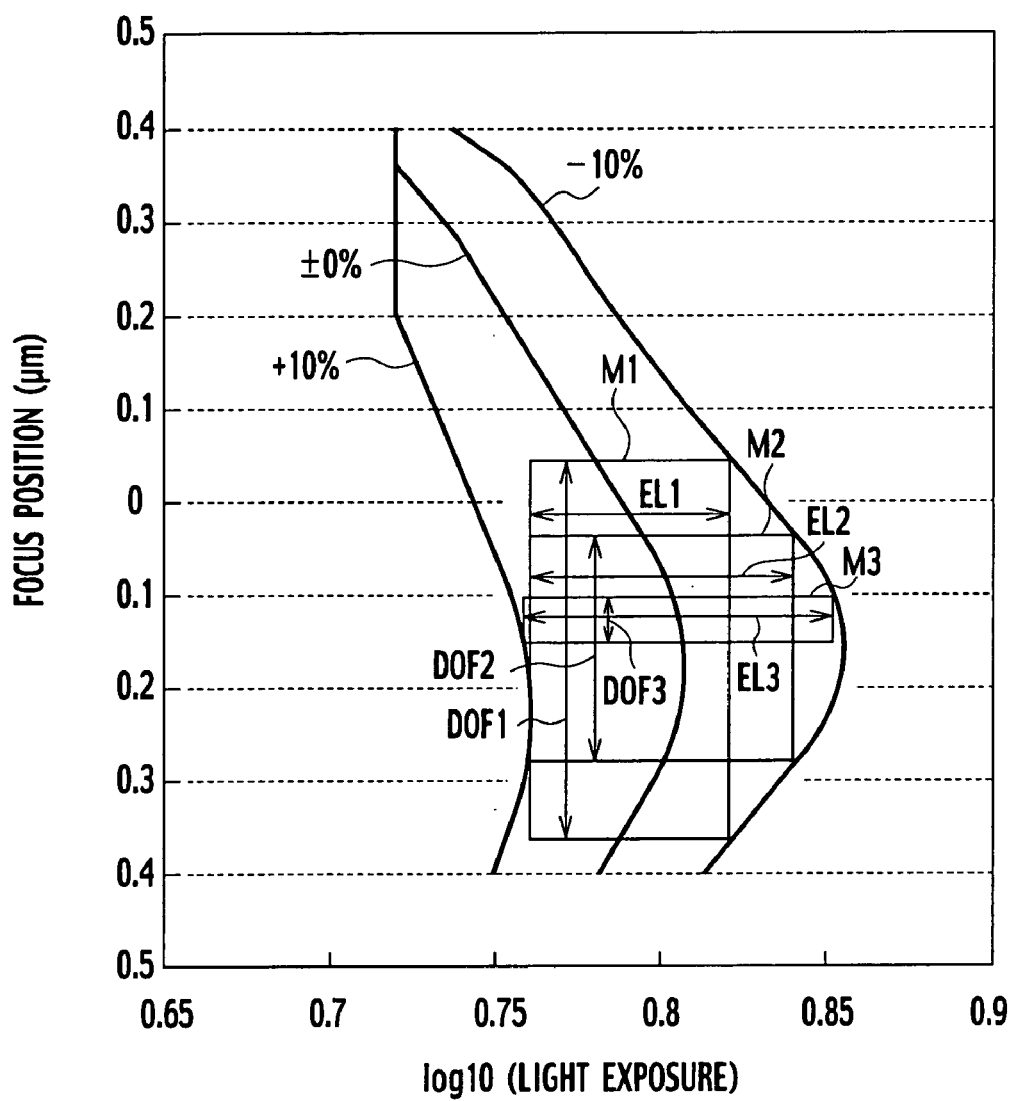
FIG. 6 is a graph illustrating a margin curve representing the relationship between the tolerances of a depth of focus and the light exposure in the method for evaluating the process margin in the first embodiment according to the present invention.
Figure 7:
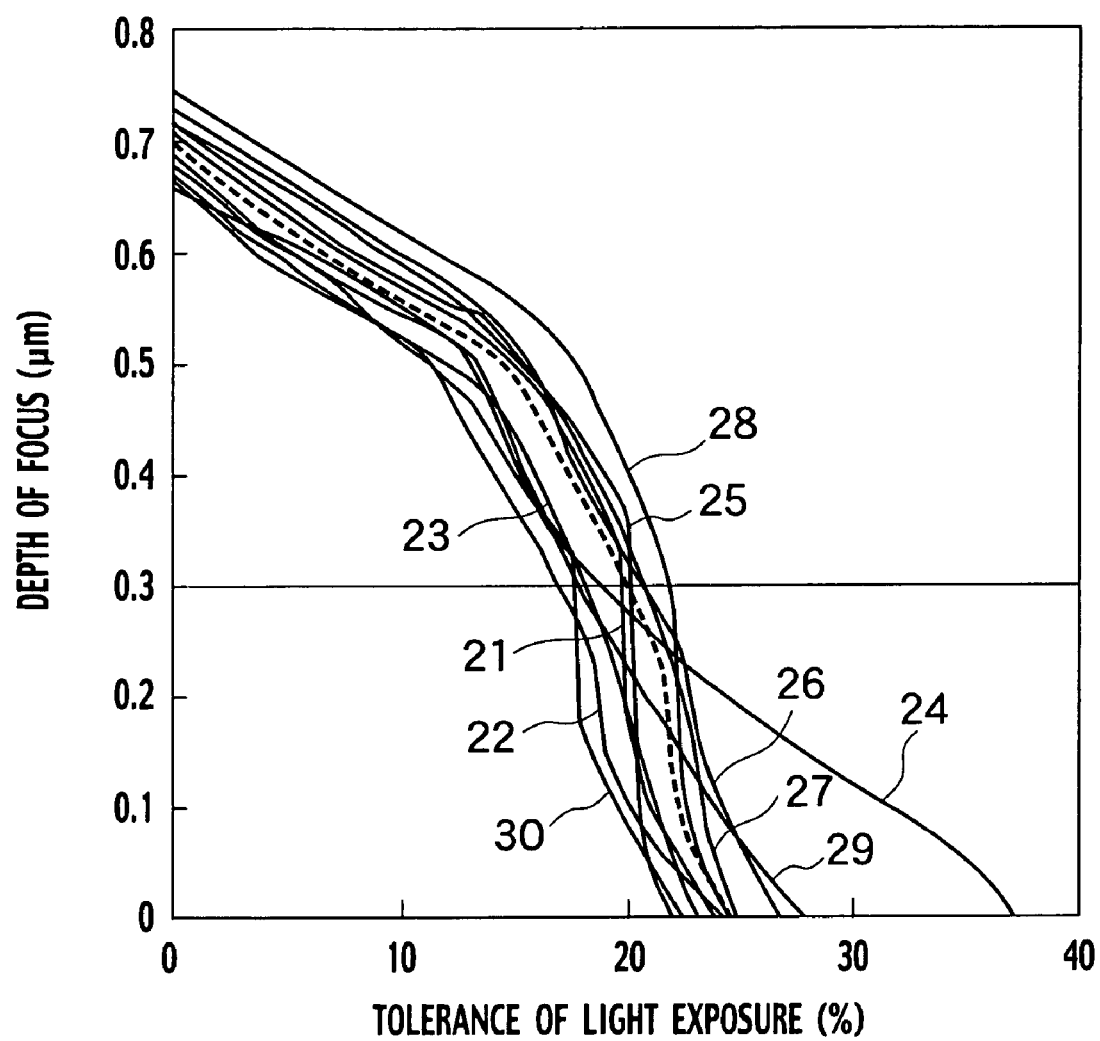
FIG. 7 is a graph illustrating variations in margin curve in the method for evaluating the process margin in the first embodiment according to the present invention.

In step S9, the margin curve calculator 9 calculates the margin curve based on the ED-tree of the pseudo measured dimensions CDr indicated by the solid line in FIG. 5. As illustrated in FIG. 6, windows M1 to M3 of the process margin are set based on the ED-tree of the tolerance of the resist dimension. Ratios of differences in logarithm of the light exposure corresponding to the lateral widths of the windows M1 to M3 to the logarithms of the light exposure represented by the left sides of the windows M1 to M3 are referred to as tolerances EL1 to EL3 of the light exposure, respectively. Differences in focus position corresponding to the vertical widths of the windows M1 to M3 are referred to as depths of focus DOF1 to DOF3, respectively. A margin curve 21 illustrated in FIG. 7 represents the relationship between the tolerances EL1 to EL3 of the light exposure and the depths of focus DOF1 to DOF3 (i.e., so-called focus tolerances). A margin curve indicated by a dotted line in FIG. 7 is a margin curve based on the ED-tree indicated by the dotted line in FIG. 5. It is determined that the margin curve 21 indicated by the solid line deviates from the margin curve indicated by the dotted line.

In step S10, it is determined whether or not the desired number of margin curves corresponds to ten. Since the result is negative, the control routine returns to step S2. This loop is repeated until the desired number of margin curves corresponds to ten. Finally, ten margin curves 21 to 30 as illustrated in FIG. 7 are obtained.

In step S11, the dispersion is calculated based on the distribution of the tolerance of the light exposure of the ten margin curves at a depth of focus of 0.3 μm corresponding to the maximum difference in height of the substrate to be exposed to the light. The tolerance EL of the light exposure of the margin curve indicated by the dotted line at the depth of focus of 0.3 μm is 19.7%. An average of the tolerances EL of the light exposures of the margin curves 21 to 30 indicated by the solid lines at the depth of focus of 0.3 μm is 19.5%. A dispersion $3\sigma_{EL}$ that triples the dispersion $\sigma_{EL}$ of the distribution of the tolerances EL of the light exposures of the margin curves 21 to 30 indicated by the solid lines at a depth of focus of 0.3 μm is 4.8%.

The width of the range, in which the margin curves 21 to 30 are distributed, provides the reproducibility or an error of the lithography process margin. In order to increase the reproducibility of the lithography process margin, the width of the range, in which the margin curves 21 to 30 are distributed, is narrowed. The width of the narrowed range is represented by the small dispersion $3\sigma_{EL}$. In this manner, it is possible to estimate the reproducibility of the process margin.

(Setting of Measurement Condition)

In the method for setting up the measurement condition in the first embodiment according to the present invention, 3.0% is first set as the desired dispersion $3\sigma_{EL}$ of the distribution of the tolerances of the light exposures of the ten margin curves at the depth of focus of 0.3 m in step S21 illustrated in FIG. 3. The setting value of the light exposure and the setting value of the focus position are set in the same manner as in FIG. 4A in step S1 illustrated in FIG. 2.

Next, in step S22, the first process margin evaluating method is carried out. An output of 4.8% is provided as the dispersion $3\sigma_{EL}$ triple the dispersion $\sigma_{EL}$ of the distribution of the tolerances EL of the light exposures of the margin curves 21 to 30 at the depth of focus of 0.3 μm. In other words, as illustrated in FIG. 8, 4% is an interval of an increment of the setting value of the light exposure in reference to the proper light exposure which corresponds to 5.25 mJ/cm² to 7.25 mJ/cm² at an interval of 0.25 mJ/cm² of the setting value of the light exposure, and the dispersion $3\sigma_{EL}$ is 4.8% at a point A of 200 nm as an interval of an increment of the plurality of setting values of the focus position.

Figure 8:
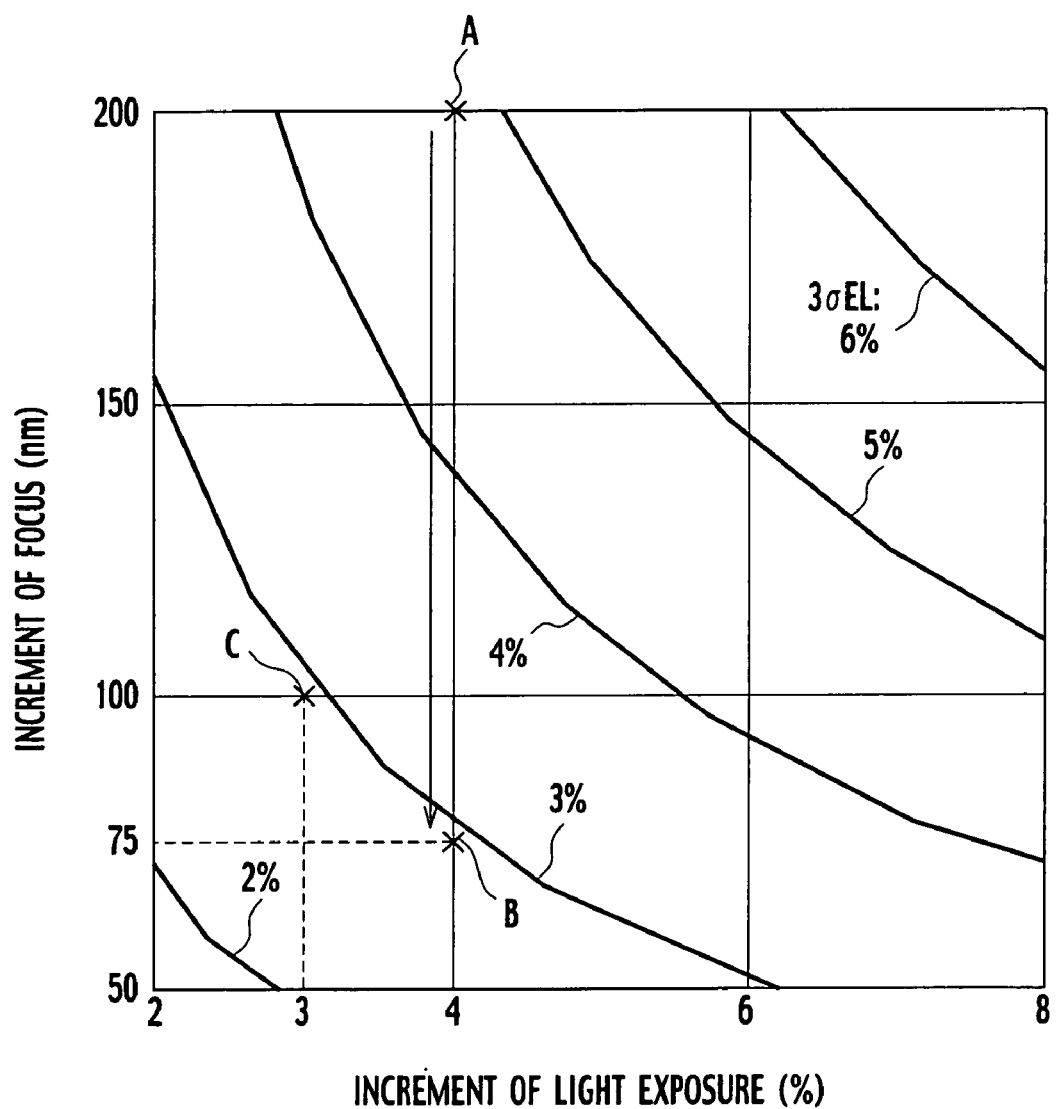
FIG. 8 is a graph illustrating the method for setting up the measurement condition in consideration of the process margin in the first embodiment according to the present invention.

In the same manner, when the dispersion $3\sigma_{EL}$ of the tolerance of the light exposure is obtained by varying the interval ΔE of the increment of the setting value of the light exposure and the interval ΔF of the increment of the setting value of the focus position, contour lines of the dispersion $3\sigma_{EL}$ of the tolerance of the light exposure as illustrated in FIG. 8 are obtained. Thus, in order to reduce the calculated dispersion $3\sigma_{EL}$, it is sufficient that the interval ΔE of the increment of the setting value of the light exposure or the interval ΔF of the increment of the setting value of the focus position is reduced. In contrast, in order to increase the calculated dispersion $3\sigma_{EL}$, it is sufficient that the interval ΔE of the increment of the setting value of the light exposure or the interval ΔF of the increment of the setting value of the focus position is increased.

In step S23, it is determined which of 4.8% as the calculated dispersion $3\sigma_{EL}$ and 3.0% as the desired dispersion is greater. Since the calculated dispersion is greater than the desired dispersion, the control routine proceeds to step S24. As indicated at a point B in FIG. 8, the interval ΔF of the increment of the setting value of the focus position is reduced to 75 nm. At the point B, the dispersion $3\sigma_{EL}$ becomes 3.0%. Since the calculated reproducibility is identical to the desired reproducibility, the control routine proceeds to step S25. Thereafter, 4% of the interval E of the increment of the setting value of the light exposure and 75 nm of the interval ΔF of the increment of the setting value of the focus position for use in the calculation are output. Otherwise, in the case where the dispersion $3\sigma_{EL}$ is to be suppressed to, for example, 3% or less, the interval E of the increment of the setting value of the light exposure and the interval AF of the increment of the setting value of the focus position may be 3% and 100 nm, respectively. These output measurement increments are used as measurement increments at the time of actual measurement, thereby determining a sampling plan with the light exposure and the focus position which are assigned in such a manner as to achieve the error of the evaluated process margin at an allowable value or less. The setting values of the light exposure and the focus position as the process conditions determined by the sampling plan can be provided with the process margin with compensable accuracy.

(Second Embodiment)

Figure 9:
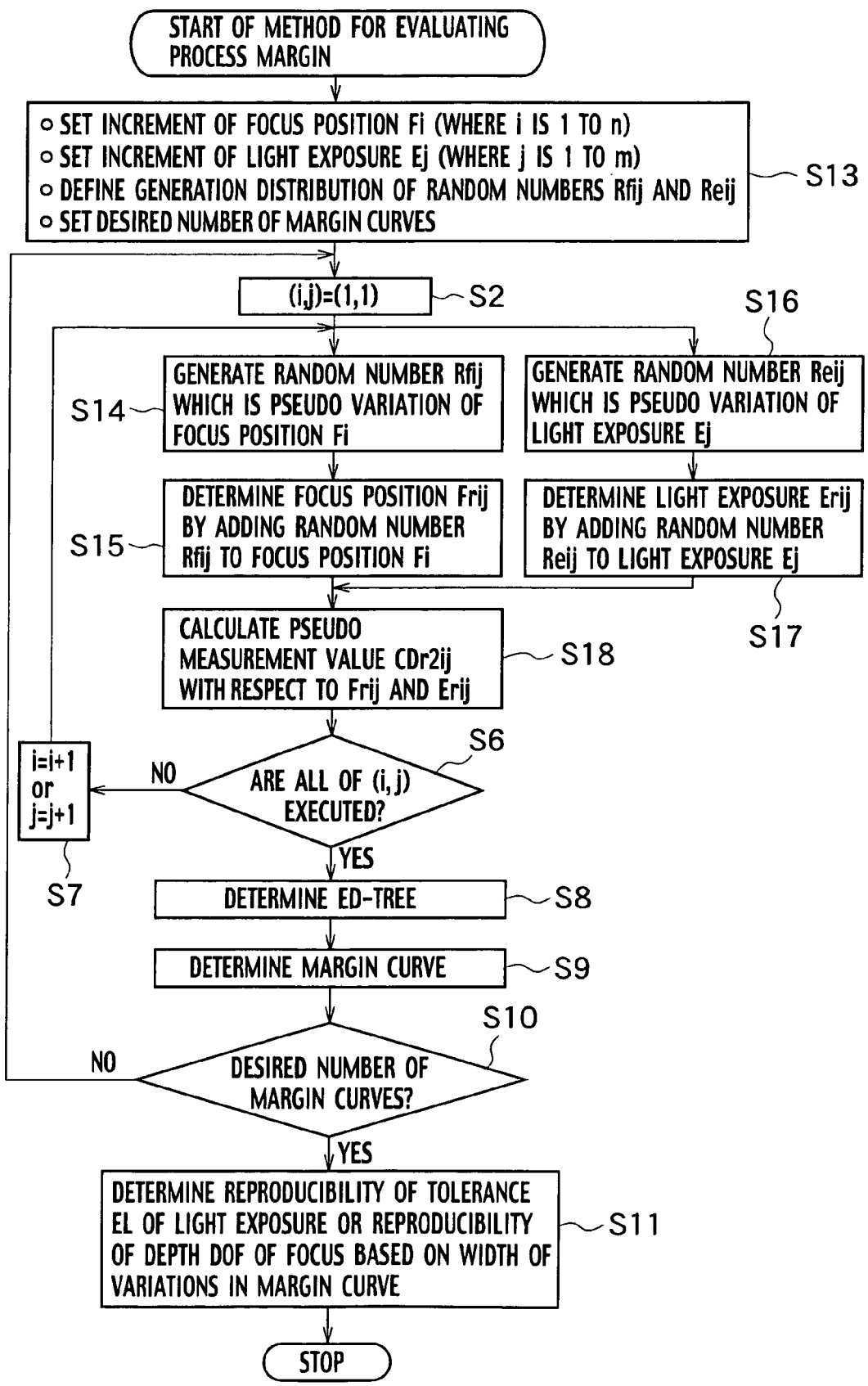
FIG. 9 is a flowchart illustrating a method for evaluating a process margin in a second embodiment according to the present invention.

A second method for evaluating a process margin in a second embodiment according to the present invention is carried out by the apparatus 2 for evaluating the process margin illustrated in FIG. 1. In the second method for evaluating a process margin, the setter 3 for setting the measurement increment first sets the plurality of setting values Ej (where j is 1 to n) of the light exposure and the plurality of setting values Fi (where i is 1 to m) of the focus position in the exposure process for forming the pattern on the substrate to be exposed to the light in step S13, as illustrated in FIG. 9. Furthermore, the setter 3 for setting the measurement increment sets a plurality of desired margin curves. Moreover, in step S13, the definer 4 for defining the random number generation distribution sets the dispersion of the generation distribution of light exposure random numbers Reij in such a manner as to be equal to the dispersion of the distribution of an effective value of the light exposure in the exposure device, and sets the dispersion of the generation distribution of position random numbers Rfij in such a manner as to be equal to the dispersion of the distribution of an effective value of the focus position in the exposure device. Each of numbers i and j is set to an initial value 1 in step S2.

In step S14, the random number generator 6 generates a position random number Rf11 with respect to the combination (1, 1). In step S15, the random number adder 7 calculates a pseudo focus position Fr11 by adding the position random number Rf11 to a setting value F1 of the focus position with respect to the combination (1, 1).

In step S16, the random number generator 6 generates a light exposure random number Re11 with respect to the combination (1, 1). In step S17, the random number adder 7 calculates a pseudo light exposure Er11 by adding the light exposure random number Re11 to a setting value E1 of the light exposure with respect to the combination (1, 1).

In step S18, the resist dimension calculator 5 calculates a pseudo measurement value CDr11 with respect to the combination (1, 1) of the pseudo light exposure Er11 and the pseudo focus position Fr11.

Next, the control routine proceeds to step S6. The method for evaluating the process margin in the second embodiment hereinafter is the same as that in the first embodiment.

In the method for evaluating the process margin in the second embodiment, an error of a process margin can be evaluated. In the methods for evaluating the process margin in the first and second embodiments, it is possible to evaluate the error of the process margin with higher accuracy by calculating the pseudo measurement values CDrij together.

(Example of Second Embodiment)

Figure 10:
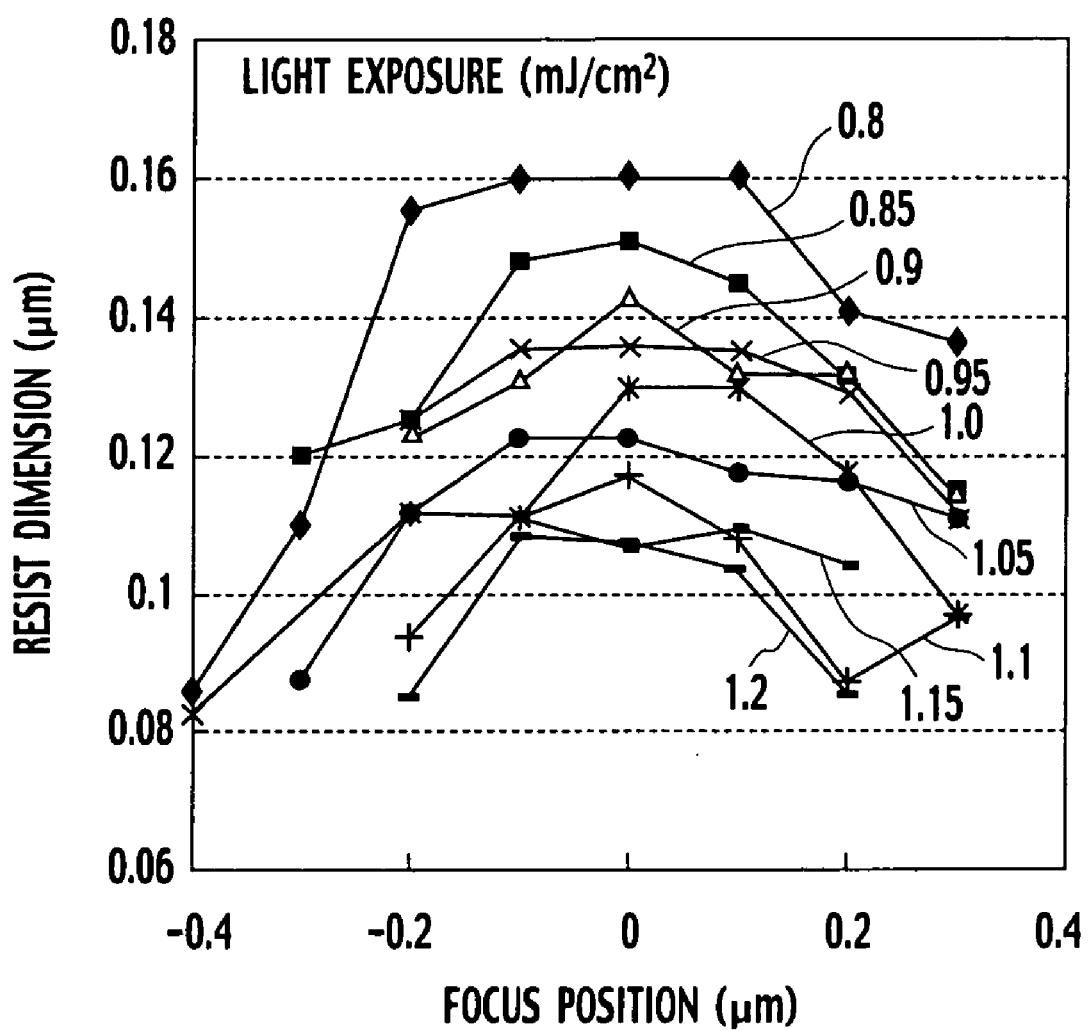
FIG. 10 a graph illustrating the step of adding random numbers generated in the dimension of a resist calculated in the method for evaluating the process margin in the second embodiment according to the present invention.

The second method for evaluating the process margin in the second embodiment according to the present invention first sets, in step S13 in FIG. 9, a plurality of setting values of the light exposure from 0.8 mJ/cm² to 1.15 mJ/cm² at an interval of 0.05 mJ/cm² and a plurality of setting values of the focus position from −0.4 µm to 0.3 µm at an interval of 0.1 µm, as illustrated in FIG. 10. The increment interval of the measurement values of the light exposure is 5% in reference to a proper light exposure. Furthermore, the desired number of margin curves is set to 32. Moreover, the dispersion σe of the light exposure random numbers and the dispersion σf of the position random numbers are set to 1% and 100 nm, respectively. An average of the light exposure random numbers is set to zero. Furthermore, an average of the position random numbers is set to zero. Each of numbers i and j is set to an initial value 1 in step S2.

In step S14, the position random number Rf11 is generated with respect to the combination (1, 1). In step S15, the pseudo focus position Fr11 obtained by adding the position random number Rf11 to the setting value F1 of the focus position is calculated with respect to the combination (1, 1). In step S16, the light exposure random number Re11 is generated with respect to the combination (1, 1). In step S17, the pseudo light exposure Er11 obtained by adding the light exposure random number Re11 to the setting value E1 of the light exposure is calculated with respect to the combination (1, 1). In step S18, the pseudo measurement value CDr11 is calculated with respect to the combination (1, 1) of the pseudo light exposure Er11 and the pseudo focus position Fr11. The pseudo measurement value CDr11 of the pattern with respect to the combination (1, 1) is calculated to be 0.087 nm, in which the setting value of the light exposure is 0.8 mJ/cm² and the setting value of the focus position is −0.4 µm. Under the exposure conditions for use in the calculation, an exposure wavelength λ is 248 nm, the number of apertures NA is 0.68, an illumination coherence σ is 0.75 and a zone shield factor is ⅔. A mask is a halftone type phase shift mask having a transmittance of 6%. The dimension of the mask is 130 nm.

As illustrated in FIG. 10, the average of the pseudo measurement values CDr11 may be set to zero, and the dispersion σCD may be added with a dimensional random number of 2 nm. Here, the dispersion σCD is assumed to be a dispersion which can vary an apparent resist dimension such as the edge roughness of the resist or the reproducibility in the dimensional measurement.

Figure 11:
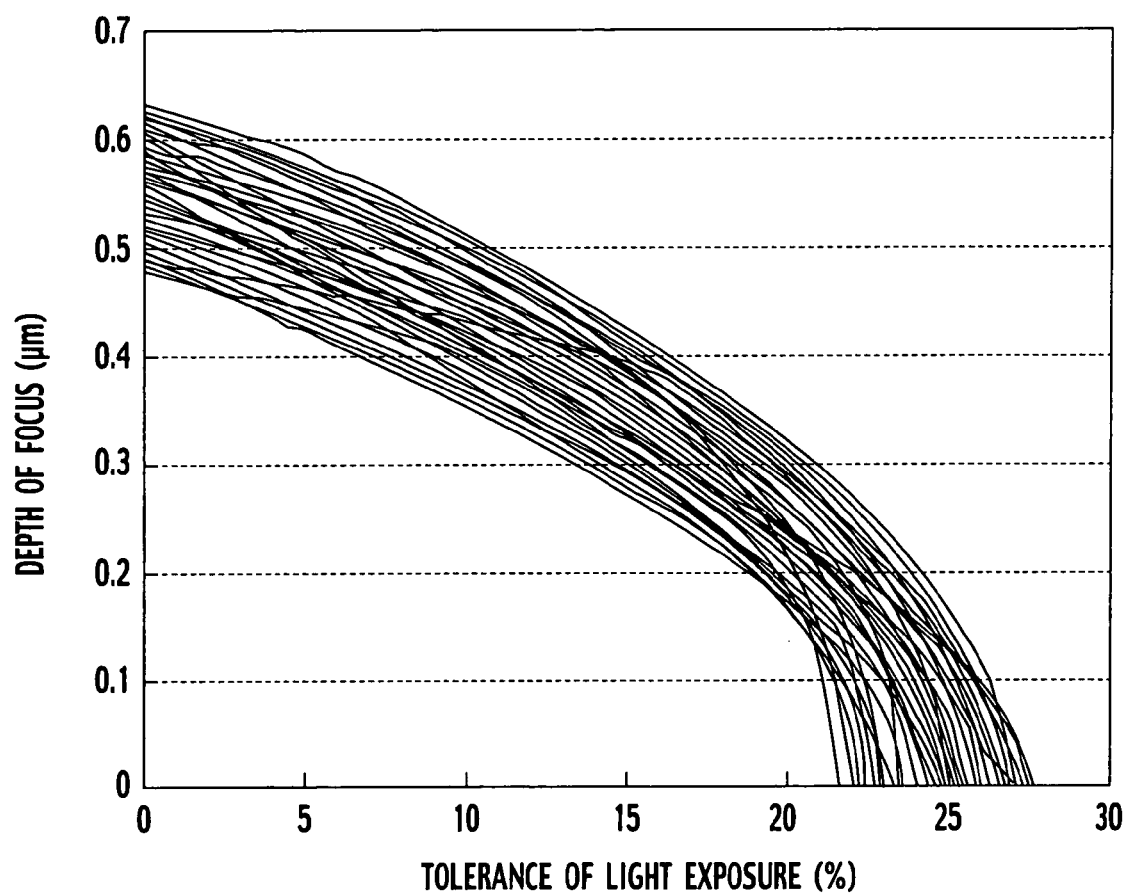
FIG. 11 is a graph illustrating variations in margin curve in the method for evaluating the process margin in the second embodiment according to the present invention.

Next, the control routine proceeds to step S6. The method for evaluating the process margin in the second embodiment hereinafter is the same as that in the first embodiment. A regression analysis is performed, so as to smooth data. The light exposure is calculated in such a manner that the pseudo measurement value CDr11 at each of the focus positions ranges within a tolerance of a dimension of ±13 nm with respect to a target dimension of 130 nm, thereby obtaining an ED-tree. Thus, 32 margin curves are provided as illustrated in FIG. 11. The width of the range, in which the 32 margin curves are distributed, provides the reproducibility or the error of the lithography process margin. A dispersion GEL of the tolerance of the light exposure at a depth of focus of 0.3 m is evaluated to be 1.5%. In this manner, the error of the process margin can be evaluated by the method for evaluating the process margin in the second embodiment.

Various modifications will become possible for those skilled in the art after receiving the teachings of the present disclosure without departing from the scope thereof.

What is claimed is:

1. A computer-implemented method for evaluating a process margin comprising:
    setting a plurality of setting values of a light exposure and a plurality of setting values of a focus position in an exposure process for forming a pattern on a substrate to be exposed to light;
    calculating a plurality of pseudo measured dimensions of the pattern with respect to each combination of the setting values of the light exposure and the setting values of the focus position;
    calculating a plurality of ED-trees and calculating a plurality of margin curves based on the pseudo measured dimensions with respect to each of the combinations; and
    calculating a dispersion of a tolerance of the light exposure of the margin curves at a depth of focus corresponding to a maximum difference in height of the substrate.

2. The computer-implemented method as claimed in claim 1, wherein a measured dimension of the pattern has a dimensional dispersion, and the calculating of the pseudo measured dimensions includes:
    calculating a calculated dimension of the pattern with respect to each of the combinations;
    generating a plurality of dimension random numbers having the dimensional dispersion with respect to each of the combinations; and
    calculating the plurality of the pseudo measured dimensions obtained by adding the dimension random numbers to the calculated dimension with respect to each of the combinations.

3. The computer-implemented method as claimed in claim 1, wherein an effective value of the light exposure has a light exposure dispersion and an effective value of the focus position has a position dispersion, and the calculating of the pseudo measured dimensions includes:
    generating a plurality of light exposure random numbers having the light exposure dispersion with respect to each of the combinations;
    calculating a plurality of pseudo light exposures obtained by adding the light exposure random numbers to the setting values of the light exposure with respect to each of the combinations;
    generating a plurality of position random numbers having the position dispersion with respect to each of the combinations;
    calculating a plurality of pseudo focus positions obtained by adding the position random numbers to the setting values of the focus position with respect to each of the combinations; and
    calculating the calculated dimension of the pattern based on the pseudo light exposure and the pseudo focus position with respect to each of the combinations, so as to calculate the pseudo measured dimensions.

4. The computer-implemented method as claimed in claim 1, wherein the setting values of one of the light exposure and logarithms of the setting values of the light exposure are set at a constant interval, and the setting values of the focus position are set at a constant interval.

5. A computer-implemented method for setting up a measurement condition of a process margin comprising:
    setting a plurality of setting values of a light exposure at equal first intervals and setting a plurality of setting values of a focus position at equal second intervals in an exposure process for forming a pattern on a substrate to be exposed to light;

calculating a plurality of pseudo measured dimensions of the pattern with respect to each combination of the setting values of the light exposure and the setting values of the focus position;

calculating a plurality of ED-trees and calculating a plurality of margin curves based on the pseudo measured dimensions with respect to each of the combinations;

calculating a dispersion of a tolerance of the light exposure of the margin curves at a depth of focus corresponding to a maximum difference in height of the substrate; and reducing one of the first interval and the second interval so as to reduce the dispersion of the tolerance of the light exposure while increasing one of the first interval and the second interval so as to increase the dispersion of the tolerance of the light exposure.

6. The computer-implemented method as claimed in claim 5, wherein a measured dimension of the pattern has a dimensional dispersion, and the calculating of the pseudo measured dimensions includes:

calculating a calculated dimension of the pattern with respect to each of the combinations;

generating a plurality of dimension random numbers having the dimensional dispersion with respect to each of the combinations; and calculating the plurality of the pseudo measured dimensions obtained by adding the dimension random numbers to the calculated dimension with respect to each of the combinations.

7. The computer-implemented method as claimed in claim 5, wherein an effective value of the light exposure has a light exposure dispersion and an effective value of the focus position has a position dispersion, and the calculating of the pseudo measured dimensions includes:

generating a plurality of light exposure random numbers having the light exposure dispersion with respect to each of the combinations;

calculating a plurality of pseudo light exposures obtained by adding the light exposure random numbers to the setting values of the light exposure with respect to each of the combinations;

generating a plurality of position random numbers having the position dispersion with respect to each of the combinations;

calculating a plurality of pseudo focus positions obtained by adding the position random numbers to the setting values of the focus position with respect to each of the combinations; and calculating the calculated dimension of the pattern based on the pseudo light exposure and the pseudo focus position with respect to each of the combinations, so as to calculate the pseudo measured dimensions.

8. A computer program product to be executed by a computer for evaluating a process margin comprising:

instructions configured to set a plurality of setting values of a light exposure and a plurality of setting values of a focus position in an exposure process for forming a pattern on a substrate to be exposed to light;

instructions configured to calculate a plurality of pseudo measured dimensions of the pattern with respect to each combination of the setting values of the light exposure and the setting values of the focus position;

instructions configured to calculate a plurality of ED-trees and configured to calculate a plurality of margin curves based on the pseudo measured dimensions with respect to each of the combinations; and instructions configured to calculate the dispersion of the tolerance of the light exposure of the margin curves at a depth of focus corresponding to a maximum difference in height of the substrate.

9. The computer program product as claimed in claim 8, wherein a measured dimension of the pattern has a dimensional dispersion, and the instructions configured to calculate the pseudo measured dimension include:

instructions configured to calculate a calculated dimension of the pattern with respect to each of the combinations;

instructions configured to generate a plurality of dimension random numbers having the dimensional dispersion with respect to each of the combinations; and instructions configured to calculate the plurality of the pseudo measured dimensions obtained by adding the dimension random numbers to the calculated dimension with respect to each of the combinations.

10. The computer program product as claimed in claim 8, wherein an effective value of the light exposure has a light exposure dispersion and an effective value of the focus position has a position dispersion, and the instructions configured to calculate the pseudo measured dimensions include:

instructions configured to generate a plurality of light exposure random numbers having the light exposure dispersion with respect to each of the combinations;

instructions configured to calculate a plurality of pseudo light exposures obtained by adding the light exposure random numbers to the setting value of the light exposure with respect to each of the combinations;

instructions configured to generate a plurality of position random numbers having the position dispersion with respect to each of the combinations;

instructions configured to calculate a plurality of pseudo focus positions obtained by adding the position random numbers to the setting value of the focus position with respect to each of the combinations; and instructions configured to calculate the calculated dimension of the pattern based on the pseudo light exposure and the pseudo focus position with respect to each of the combinations, so as to calculate the pseudo measured dimensions.

11. The computer program product as claimed in claim 8, wherein the setting values of one of the light exposures and logarithm of the setting values of the light exposure are set at a constant interval, and the setting values of the focus positions are set at a constant interval.

12. A computer program product to be executed by a computer for setting a measurement condition of a process margin comprising:

instructions configured to set a plurality of setting values of a light exposure at equal first intervals and setting a plurality of setting values of a focus position at equal second intervals in an exposure process for forming a pattern on a substrate to be exposed to light;

instructions configured to calculate a plurality of pseudo measured dimensions of the pattern with respect to each combination of the setting values of the light exposure and the setting values of the focus position;

instructions configured to calculate a plurality of ED-trees and calculating a plurality of margin curves based on the pseudo measured dimensions with respect to each of the combinations;

instructions configured to calculate a dispersion of a tolerance of the light exposure of the margin curves at a depth of focus corresponding to a maximum difference in height of the substrate; and instructions configured to reduce one of the first interval and the second interval so as to reduce the dispersion of the tolerance of the light exposure while configured to increase one of the first interval and the second interval so as to increase the dispersion of the tolerance of the light exposure.

13. The computer program product as claimed in claim 12, wherein a measured dimension of the pattern has a dimensional dispersion, and the instructions configured to calculate the pseudo measured dimension include:

instructions configured to calculate a calculated dimension of the pattern with respect to each of the combinations;

instructions configured to generate a plurality of dimension random numbers having the dimensional dispersion with respect to each of the combinations; and instructions configured to calculate the plurality of the pseudo measured dimensions obtained by adding the dimension random numbers to the calculated dimension with respect to each of the combinations.

14. The computer program product as claimed in claim 12, wherein an effective value of the light exposure has a light exposure dispersion and an effective value of the focus position has a position dispersion, and the instructions configured to calculate the pseudo measured dimensions include:

instructions configured to generate a plurality of light exposure random numbers having the light exposure dispersion with respect to each of the combinations;

instructions configured to calculate a plurality of pseudo light exposures obtained by adding the light exposure random numbers to the setting value of the light exposure with respect to each of the combinations;

instructions configured to generate a plurality of position random numbers having the position dispersion with respect to each of the combinations;

instructions configured to calculate a plurality of pseudo focus positions obtained by adding the position random numbers to the setting value of the focus position with respect to each of the combinations; and instructions configured to calculate the calculated dimension of the pattern based on the pseudo light exposure and the pseudo focus position with respect to each of the combinations, so as to calculate the pseudo measured dimensions.

* * * * *